(12) United States Patent
Onishi

(10) Patent No.: US 7,953,135 B2
(45) Date of Patent: May 31, 2011

(54) VERTICAL CAVITY SURFACE EMITTING LASER DIODE (VCSEL) WITH ENHANCED EMITTING EFFICIENCY

(75) Inventor: Yutaka Onishi, Yokohama (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 322 days.

(21) Appl. No.: 12/230,445

(22) Filed: Aug. 28, 2008

(65) Prior Publication Data

US 2009/0080487 A1 Mar. 26, 2009

(30) Foreign Application Priority Data

Aug. 31, 2007 (JP) ................. P2007-226578

(51) Int. Cl.
*H01S 3/08* (2006.01)

(52) U.S. Cl. .................. 372/96; 372/50.11; 372/50.124; 372/46.011; 372/99

(58) Field of Classification Search ............... 372/50.11, 372/50.124, 46.011, 96, 99
See application file for complete search history.

(56) References Cited

U.S. PATENT DOCUMENTS

| | | | | |
|---|---|---|---|---|
| 5,245,622 A | * | 9/1993 | Jewell et al. | ........... 372/45.01 |
| 6,765,238 B2 | * | 7/2004 | Chang et al. | ............. 257/104 |
| 6,898,215 B2 | * | 5/2005 | Naone et al. | ................. 372/4 |
| 6,936,486 B2 | * | 8/2005 | Cheng et al. | ............... 438/22 |

OTHER PUBLICATIONS

N. Nishiyama et al, "High efficiency long wavelength VCSEL on InP grown by MOCVD", Electronics Letters, Mar. 6, 2003, vol. 39, No. 5, pp. 437-439.

\* cited by examiner

*Primary Examiner* — Minsun Harvey
*Assistant Examiner* — Joshua King
(74) *Attorney, Agent, or Firm* — Smith, GAmbrell & Russell, LLP

(57) ABSTRACT

A vertical cavity surface emitting laser diode (VCSEL) is disclosed, which reduces the light scattering by the step formed at the interface between the dielectric DBR and the semiconductor that reflects the mesa shape of the tunnel junction. The dielectric DBR of the invention includes a plurality of first films with relatively smaller refractive index and a plurality of second films with relatively larger refractive index. These first and second films are alternately stacked to each other to cause the periodic structure of the refractive indices. The VCSEL of the invention, different from the conventional device, provides the dielectric film with relatively larger refractive index that directly comes in contact with the semiconductor to set the node of the optical standing wave at the interface between the dielectric DBR and the semiconductor.

5 Claims, 4 Drawing Sheets

(a)

(b)

VERTICAL CAVITY SURFACE EMITTING LASER DIODE (VCSEL) WITH ENHANCED EMITTING EFFICIENCY

BACKGROUND OF THE INVENTION

1. Field of the Invention

The present invention relates to a vertical cavity surface emitting laser diode (hereafter denoted as VCSEL).

2. Related Background Art

Nishiyama et al. has reported a VCSEL with a buried tunnel junction in "Electronics Letters, vol. 39(5), (2003) pages 437-439." Their VCSEL provides, on the InP substrate, a semiconductor distributed Bragg reflector (hereafter denoted as DBR) made of a combination of AlGaInAs and InP, an active layer, an n-type InP layer to bury the tunnel junction, and a dielectric DBR made of a combination of amorphous silicon (a-Si) and aluminum oxide ($Al_2O_3$).

Because the tunnel junction buried by the n-InP layer has a mesa shape, the top of the n-InP layer inherently provides a step reflecting the mesa shape. The dielectric DBR surrounds this step and the dielectric DBR comprises a plurality of first films with relatively smaller refractive index and a plurality of second films with relatively larger refractive index alternately stacked to each other. Moreover, the second film with smaller refractive index comes in contact with the top of the semiconductor; accordingly, the interface between the semiconductor, whose refractive index is generally higher than that of the second film, and the first film causes a large difference in the refractive index, which enhances the scattering of the light thereat. Because the dielectric film directly coming in contact with the semiconductor is the first film with relatively smaller refractive index, the anti-node of the optical standing wave positions at the interface. Accordingly, the scattering of the light at the interface becomes relatively enhanced.

SUMMARY OF THE INVENTION

A VCSEL device according to the present invention comprises a semiconductor Bragg reflector (hereafter denoted as DBR), an active layer provided on the semiconductor DBR, a junction region on the active layer to confine the current injected into the active layer, a semiconductor layer and a dielectric DBR.

One of features of the present invention is that the dielectric DBR includes a first dielectric layer directly coming in contact with the semiconductor layer and a second dielectric layer on the first layer, and the refractive index of the first dielectric layer is greater than that of the second dielectric layer, which is diametrically opposite to the conventional configuration. This configuration of the refractive index of the dielectric layers may shift the node of the optical standing wave resonated within the optical resonator defined between the semiconductor DBR and the dielectric DBR.

Accordingly, the optical power of the light scattered at the interface between the semiconductor layer and the first dielectric layer may be relatively reduced, even when the top surface of the semiconductor layer provides a step reflecting the mesa shape of the junction region that is buried with the semiconductor layer.

In the VCSEL device of the invention, the first dielectric layer may comprise a first dielectric film directly coming in contact with the semiconductor layer and a second dielectric film on the first dielectric film. The second dielectric film may have a refractive index smaller than that of the first film and greater than that of the second dielectric layer, while, the thickness of the first dielectric film is set to $\lambda/4/n_{1AV}$, where $\lambda$ is the emission wavelength of the VCSEL device and $n_{1AV}$ is the average refractive index of the first dielectric layer that is determined as $n_{AV1}=(d_1 \times n_1 + d_2 \times n_2)/(d_1+d_2)$, where $d_1$, $n_1$ and $d_2$, $n_2$ are the thicknesses and the refractive indices of the first and second dielectric films, respectively.

This layer configuration of the first dielectric layer may also set the node of the optical standing wave at the interface between the first film and the semiconductor layer, which may also reduce the light scattered at the interface effectively.

In the VCSEL device of the invention, the semiconductor layer may include a spacer layer and another semiconductor DBR between the spacer layer and the dielectric DBR, and this spacer layer buries the junction region. The other semiconductor DBR may constitute a hybrid DBR cooperating with the dielectric DBR, and the semiconductor DBR and this hybrid DBR constitute the optical resonator of the VCSEL device. Even the VCSEL device provides the hybrid DBR, the node of the optical standing wave locates at the interface between the dielectric DBR and the other semiconductor DBR, the contribution of the light scattered at the interface may be relatively reduced even the step reflecting the mesa shape of the junction region exits in the interface.

DESCRIPTION OF THE PREFERRED EMBODIMENTS

The present invention will be easily understood by referring to drawings and descriptions provided hereinbelow. Next, embodiments of the present invention will be described as refereeing to accompanying drawings. In the description, the same elements will be referred by the same symbols or the same numerals without overlapping explanations.

Figure 1:
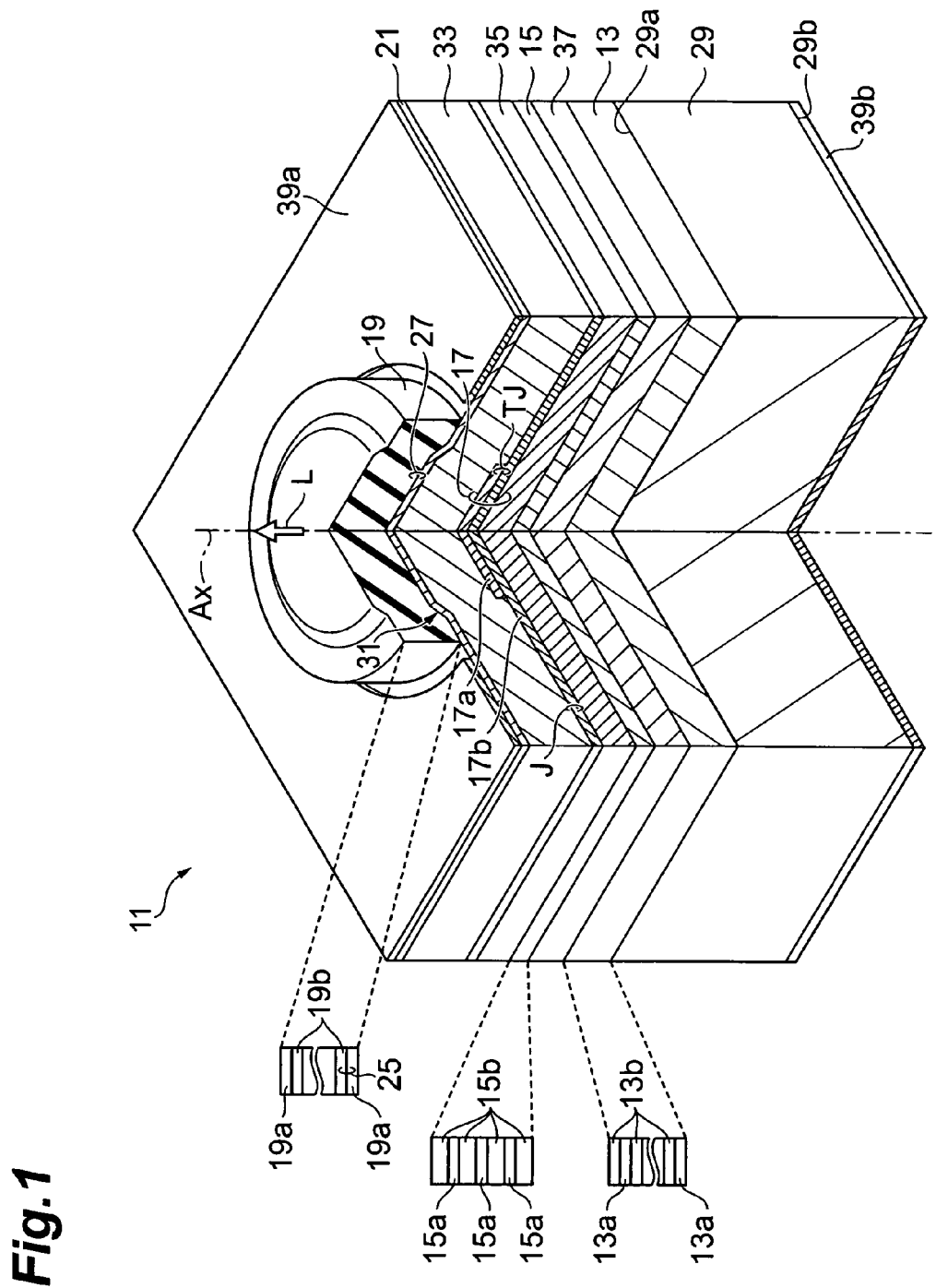
FIG. 1 schematically illustrates a VCSEL device according to an embodiment of the invention, where a portion of which is broken to show the inner structure of the device.

FIG. 1 is a partially broken perspective view to show the structure of the vertical cavity surface emitting laser diode (VCSEL) according to an embodiment of the present invention. The VCSEL 11 comprises a first distributed Bragg reflector 13 made of semiconductor materials, hereafter called as the semiconductor DBR, an active layer 15, a junction region 17 and a second Bragg reflector 19 made of dielectric materials, hereafter called as the dielectric DBR, and a semiconductor layer 21 made of group III-V compound semiconductor materials. The semiconductor DBR 13 includes a plurality of first semiconductor layers 13a and a plurality of second semiconductor layers 13b alternately stacked to each other. The active layer 15 is provided on the semiconductor DBR 13. The junction region 17 that includes a tunnel junction TJ is provided on the active layer 15 so as to confine the current therein. The dielectric DBR 19, which is made of a plurality of dielectric films, has a periodic distribution 25 of the refractive index thereof, which corresponds to the film stack, along the axis Ax. The semiconductor layer 21 is put between the junction region 17 and the dielectric DBR 19.

FIG. 2A is a cross section of the VCSEL 11 showing the interface between the dielectric DBR 19 and the semiconductor layer 21. The dielectric DBR 19 includes a plurality of first dielectric films 19a and a plurality of second dielectric films 19b alternately stacked to each other. The periphery of the first dielectric films 19a substantially corresponds to the periphery of the second dielectric films 19b. The first dielectric films 19a show a first refractive index $n_{AV1}$ in average, which is smaller than the refractive index of the semiconductor layer 21, while, the second dielectric films 19b show a second refractive index $n_{AV2}$ in average smaller than the first refractive index $n_{AV1}$. Thus, the dielectric DBR 19 shows the periodic distribution 25 of the refractive index thereof along the axis Ax. Practical magnitudes of respective indices have a relation of $n_{SEMI} > n_{AV1} > n_{AV2}$, where $n_{SEMI}$ corresponds to the refractive index of the semiconductor layer 21. This configuration of the refractive index of the dielectric DBR 19 may effectively reduce the light scattering, namely the Fresnel reflection, occurred at the interface 27 between the semiconductor layer 21 and the first dielectric layer 19a.

Referring to FIG. 1 again, the VCSEL 11 forms the semiconductor DBR 13, the active layer 15, the junction region 17 and the semiconductor layer 21 on the primary surface 29a of the semiconductor substrate 29. Accordingly, the semiconductor layer 21, namely the top of the layer stack, is inherently attributed with a step 31 which corresponds to the junction region 17. However, the layer configuration of the dielectric DBR 19 accompanied with the semiconductor layer 21 mentioned above may effectively reduce the light scattering at the step 31.

Figure 3:
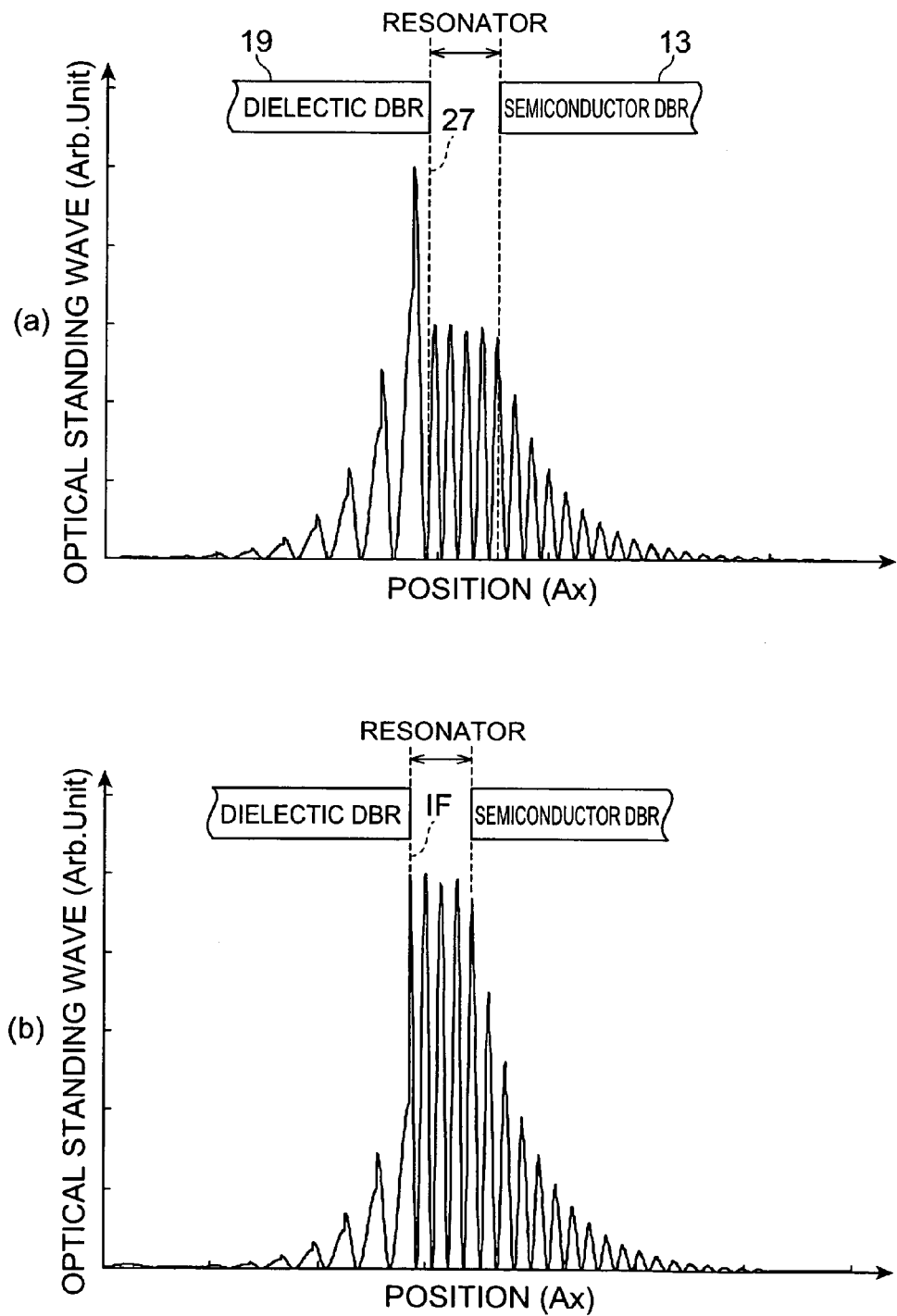
FIG. 3A schematically illustrates the optical standing wave within the optical resonator according to the present invention.
FIG. 3B illustrates the standing wave appeared in the conventional configuration.

The semiconductor DBR 13 and the dielectric DBR 19 constitute an optical resonator containing the active layer 15. The light L is emitted through the dielectric DBR 19. FIG. 3A schematically illustrates the distribution of the optical standing wave within the optical resonator. The horizontal axis corresponds to the position on the axis Ax, while, the vertical axis shows the strength of the electric field of the light. The VCSEL 11 provides a node of the electric field distribution of the light at the interface 27 between the dielectric DBT 19 and the semiconductor layer 21, which makes the strength of the light scattered at the interface 27 relatively small. The distance between the semiconductor DBR 13 and the dielectric DBR 19, which is equivalent to the length of the optical resonator, may be adjusted such that the node of the electric field is positioned at the interface 27.

FIG. 3B also shows the field distribution of the light in another VCSEL with a structure different from those of the VCSEL 11, where a dielectric film with relatively small refractive index is provided on the semiconductor layer and another dielectric film with relatively larger refractive index is stacked on the former dielectric film, which is opposite to the configuration of the present VCSEL shown in FIG. 1. In this other VCSEL, the field distribution within the optical resonator shows an anti-node at the interface IF between the dielectric DBR and the semiconductor layer. Accordingly, the light scattering at the interface IF is substantially left.

Referring to FIG. 1 again, the junction region 17 of the VCSEL 11 includes a layer 17a with the first conduction type and the second layer 17b with the second conduction type. The primary surface 17c of the second layer 17b is divided into two areas, the first area 17d and the second area 17e surrounding the first area 17d. The first layer 17a is positioned on the first area 17d to form a mesa. The junction region includes the tunnel junction TJ to confine the current provided to the VCSEL 11. The top surface of the semiconductor layer 21 provides the step 31 reflecting the shape of this mesa; however, even the step 31 exits in the top surface, the light scattered at the step 31 may be relatively small because the node of the electric field of the light positions at the interface 27 between the dielectric DBR 19 and the semiconductor layer 21.

The VCSEL 11 further provides the first spacer layer 33 made of III-V compound semiconductor material with the first conduction type. On the first space layer 33 is provided with the semiconductor layer 21 that shows a function of the contact layer. The first spacer layer 33 forms a p-n junction J to the second layer 17b with the second conduction type. This junction J is reversely biased when the VCSEL receives the bias voltage.

The VCSEL 11 shown in FIG. 1 has the active layer 15 of the multiple quantum well (MQW) structure including a plurality of well layers 15a and a plurality of barrier layers 15b alternately stacked to each other. However, the configuration of the active layer may be optionally determined depending on the application, the cost and the like.

The VCSEL 11 further provides the second spacer layer 35 formed on the active layer 15. The second spacer layer 35 is made of group III-V compound semiconductor material with the second conduction type. The VCSEL 11 may further provide the third spacer layer 37 put between the semiconductor DBR 13 and the active layer 15. The third spacer layer 37 may be made of group III-V compound semiconductor material with the first conduction type.

The VCSEL 11 provides a first electrode 39a, an anode, formed on the semiconductor layer 21 and a second electrode 39b, a cathode, formed on the back surface 29b of the substrate 29. The table 1 below summarizes the configuration of the VCSEL 11.

TABLE 1

| Conditions of layers | |
|---|---|
| substrate 29 | n-type GaAs |
| semiconductor DBR 13 | 32 pairs of GaAs/Al$_{0.9}$Ga$_{0.1}$As |
| third spacer layer 37 | silicon doped GaAs |
| active layer 15 | GaAs with 3 pairs of In$_{0.2}$Ga$_{0.8}$As/GaAsGaAs 4-GaAs layers sandwiching 3-In$_{0.2}$Ga$_{0.8}$As layers alternately |
| second spacer layer 35 | carbon doped GaAs |
| junction region 17 | silicon doped In$_{0.1}$Ga$_{0.9}$As and carbon doped In$_{0.1}$Ga$_{0.9}$As, which forms the n+/p+ junction |
| first spacer layer 33 | silicon doped GaAs |
| contact layer 21 | n+ GaAs |
| dielectric DBR 19 | TiO$_2$ and 7 pairs of SiO$_2$/TiO$_2$ |

The VCSEL 11 may be formed by a process explained herein below. First, a stack of semiconductor layers from the semiconductor DBR 13 to the junction region 17 in the list shown above were grown on the n-type GaAs by the Organic Metal Vapor Phase Epitaxy (OMVPE) technique. Subsequently, the process formed a resist mask with a circular shape whose diameter was 5 μm on the junction region 17. The wet etching of the n+ In$_{0.1}$Ga$_{0.9}$As layer using this resist mask formed a mesa containing the tunnel junction with a diameter of 5 μm. Finally, rest layers of the first spacer layer 33 and the contact layer 21, each made of Si-doped GaAs, were grown on the junction region 17.

Figure 2:
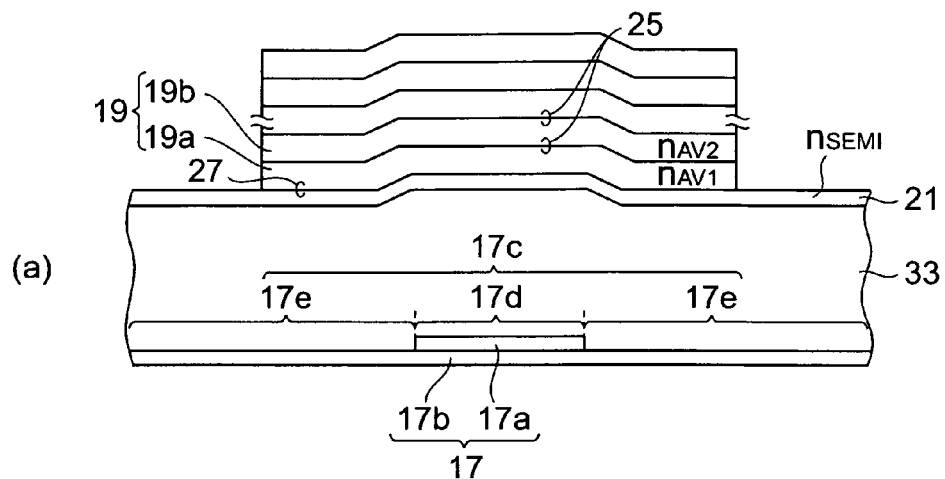
FIG. 2A emphasizes the interface between the semiconductor layer and the dielectric DBR of the VCSEL device, and FIG. 2B also emphasizes interface of the VCSEL device according to one modification of the invention, where the first dielectric layer includes first and second dielectric films.
Figure 2:
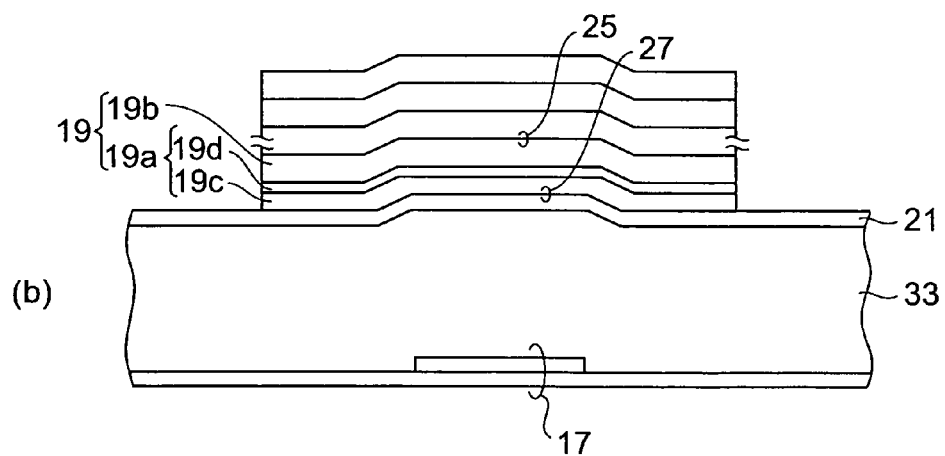

Subsequently, two devices were formed, one of which provided the dielectric DBR 19 whose configuration is shown in FIGS. 1 and 2, which is denoted as device B, and the other of which provides the dielectric DBR with the conventional configuration, which is denoted as device C.

Specifically, the device B was formed as follows: after depositing the anode and the cathode on the contact layer 21 and the back surface of the substrate 29, respectively, a photo resist was patterned such that the anode on the contact layer 21 is covered, while, a portion including the step reflecting the mesa of the junction region 17 is exposed. First, a TiO₂ film was deposited on the contact layer 21; subsequently, seven pairs of SiO₂/TiO₂ films were formed on the first TiO₂ film. Removing the films deposited on the patterned photo resist by the lift-off technique, the dielectric DBR 19 was obtained.

On the other hand, the device C was processed as follows: first, a portion of the contact layer 21 including the step reflecting the mesa of the junction region 17 was removed. Second, the anode and the cathode electrodes were formed on the contact layer 21 and the back surface of the substrate 29, respectively. After the photo resist was patterned so as to cover the anode electrode and to expose the etched portion of the contact layer 21, a seven pairs of SiO₂/TiO₂ were deposited. Similar to the device B, the films deposited on the photo resist was removed by the lift-off, the device C with the conventional dielectric DBR was completed. Here, the total thickness of the semiconductor layers, 13 to 21, shown in the above table were thicker by $\lambda/n/4$ μm than that of the device B to adjust the phase within the optical resonator.

The device C had performances of the maximum power of 2 mW and the threshold current of 1.5 mA at a room temperature, while, the device B had the maximum power of 2.5 mW and the threshold current of 1.0 mA. Both devices, B and C, provided the step on the top surface of the semiconductor layer reflecting the mesa of the junction region 17. Referring to FIGS. 3A and 3B again, FIG. 3A shows an optical standing wave of the device B, while, FIG. 3B shows an optical standing wave for the device C. The device C positions the anti-node of the optical standing wave on the top of the semiconductor layer, where the light scattering at the interface between the semiconductor layer and the first dielectric film SiO₂, especially, the scattering at the step on the top surface of the semiconductor layer, substantially remains. On the other hand, the device B positions the node of the optical standing wave on the top of the semiconductor layer. Accordingly, even the top of the semiconductor layer provides the step reflecting the mesa of the junction region and the light is substantially scattered at the step, the magnitude of the scattered light may be relatively reduced.

Thus, the device B realizes the performances of the low threshold current and of the high optical power. The device C is necessary to remove the contact layer to reduce the optical absorbing loss thereat because the anti-node positions at the top of the contact layer. While, because the device B sets the node of the optical standing wave at the top of the contact layer, the removing of the contact layer 21 becomes optional; accordingly, the process may be simplified.

The dielectric DBR 19 may be made of TiO₂, Ta₂O₅, ZnS, ZrO₂, Si₃N₄ and so on for the first layer. According to practical trials performed by the inventor, the devices providing the first dielectric film made of one of those materials brought a low threshold current and high output power similar to those realized in the device B. Various materials, such as amorphous silicon (a-Si), TiO₂, Ta₂O₅, ZnS, ZrO₂, Si₃N₄ and so on, are applicable to the dielectric films with relatively high refractive index, while, SiO₂, Al₂O₃, CaF₂ and so on are applicable to the other dielectric films with relatively low refractive index.

FIG. 2B is a cross section of a VCSEL with a modified configuration in the dielectric DBR, where the dielectric film 19a provided on the semiconductor material 21 comprises two types of dielectric films, 19c and 19d. The first film 19c comes in contact with the semiconductor material 21, while, the second film 19d has a refractive index between that of the first film 19c and the second average refractive index $n_{AV2}$. The total thickness of the first and second films, 19c and 19d, corresponds to $\lambda/4/n_{AV1}$, where $\lambda$ is an emission wavelength of the device and $n_{AV1}$ is the first average refractive index calculated by $(d_1 \cdot n_1 + d_2 \cdot n_2)/(d_1 + d_2)$, where $d_1$ and $d_2$ are thickness of the first 19c and second films 19d, respectively; $n_1$ and $n_2$ are the refractive indices of respective films.

Figure 4:
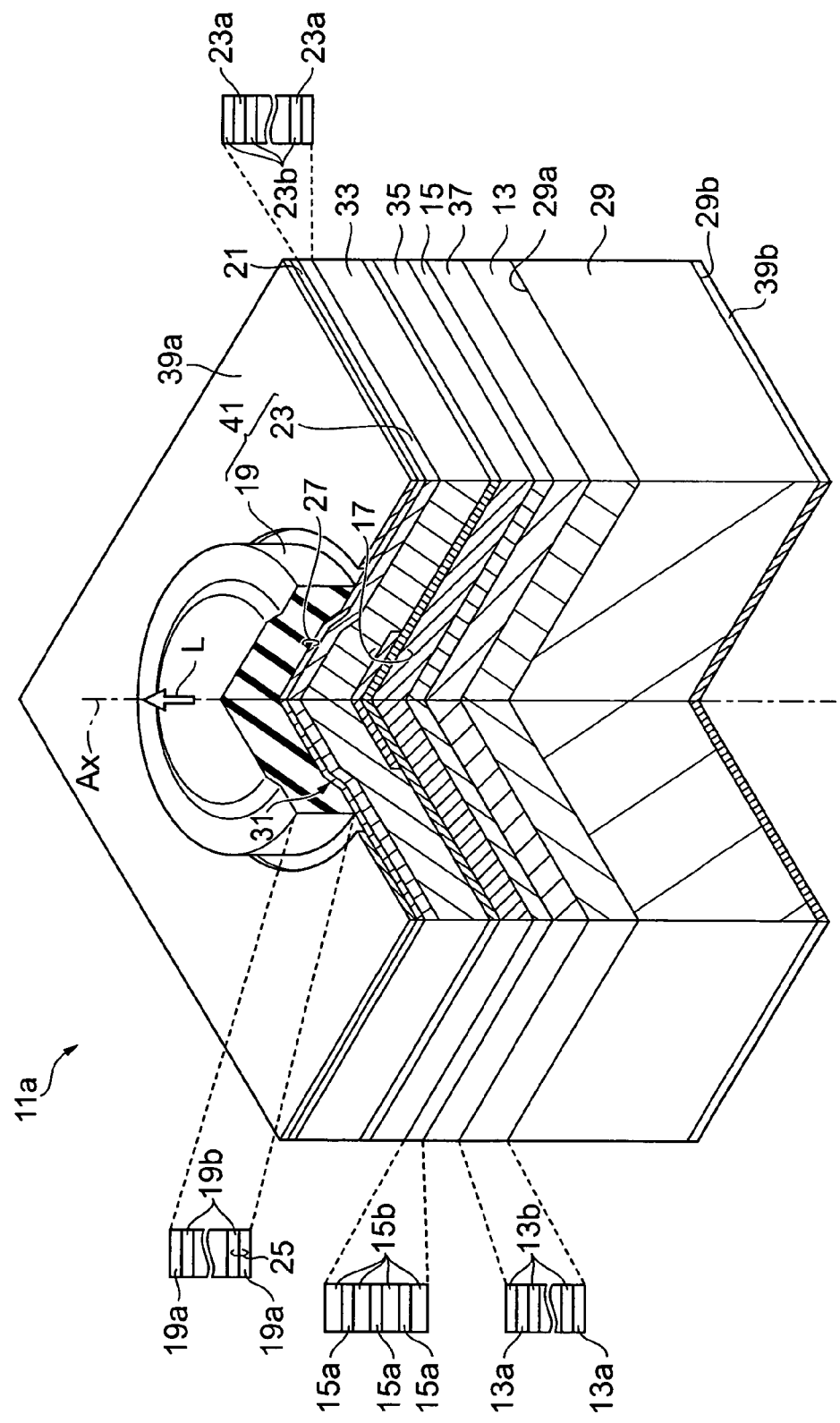
FIG. 4 schematically illustrates another VCSEL device according to one modification of the invention, where semiconductor layer includes another semiconductor DBR that forms the hybrid DBR combined with the dielectric DBR.

FIG. 4 schematically illustrates still another example of the VCSEL 11a according to the present invention. The VCSEL 11a further provides another semiconductor DBR 23 on the first spacer layer 33. This Bragg reflector 23 includes a plurality of third semiconductor layers 23a and a plurality of fourth semiconductor layers 23b alternately stacked to the third semiconductor layers. The other semiconductor DBR 23 forms, cooperating with the dielectric DBR 19 and the semiconductor layer 21, the hybrid Bragg reflector (hereafter denoted as hybrid DBR) 41. The hybrid DBR 41 and the semiconductor DBR 13 constitutes the optical resonator for the VCSEL 11a. Because the node of the standing wave of the electric field positions at the interface 27 between the semiconductor layer 21 and the dielectric DBR 19 even in this VCSEL 11a, the magnitude of the light scattered at the interface, in particular, the light scattered at the step of the interface 27, becomes relatively small. In this VCSEL 11a, the thickness of the contact layer 21 is adjusted to a value, $\lambda/4/n$, where n is the refractive index of the contact layer 21 such that the contact layer 21 constitutes a portion of the hybrid DBR 41.

The contact layer 21 simultaneously serves the topmost layer of the additional DBR reflector 23; accordingly, the thickness of the contact layer 21 is so adjusted to satisfy the phase condition of the DBR reflector 23. Even in this VCSEL 11a, the node of the optical standing wave locates at the interface 27 between the contact layer 21 and the dielectric DBR 19, the optical power of the light scattered at the interface 27 may be relatively reduced.

According to the embodiments above described, the VCSELs may be realized, in which the contribution of the light scattered at the interface between the semiconductor and the dielectric DBR is reduced even the interface inherently provides the projection reflecting the mesa of the tunnel junction.

As illustrated in FIG. 1, burying the mesa 17 of the tunnel junction region by the re-growth of the spacer layer 33 and the contact layer 21, the top of the semiconductor layer 21 inherently forms the step reflecting the mesa 17. Because this step 31 is surrounded by the dielectric DBR 19, the light which becomes coherent within the resonator may be scattered at the interface providing a large difference in the refractive index between materials forming the interface. However, the VCSEL according to the present invention forms the dielectric film that has a thickness corresponding to the quarter wavelength $\lambda/4/n$ and a refractive index smaller than that of the top of the semiconductor layer and greater than that of the dielectric films constituting the dielectric DBR. This dielectric film brings the node of the optical standing wave at the interface between the top of the semiconductor layer and the dielectric film. Thus, the scattering of the light at the interface may become relatively reduced. Moreover, the node of the optical standing wave exists within the contact layer that may reduce the absorption loss therein, the removal of the contact layer before forming the dielectric DBR becomes optional.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A VCSEL device, comprising:
a semiconductor Bragg reflector;
a semiconductor active layer formed on said semiconductor Bragg reflector;
a junction region provided on said active layer and configured to confine a current injected into said active layer, said junction region including a pn junction;
a semiconductor layer provided on said junction region; and
a dielectric Bragg reflector provided on said semiconductor layer, said dielectric Bragg reflector including a first layer directly coming in contact with said semiconductor layer and a second layer provided on said first film,
wherein said first layer has a refractive index greater than a refractive index of said second layer,
wherein said first layer of said dielectric Bragg reflector includes a first dielectric film and a second dielectric film, said first dielectric film directly coming in contact with said semiconductor layer,
wherein said second dielectric film has a refractive index smaller than a refractive index of said first dielectric film and greater than said refractive index of said second layer, and
wherein said first layer has a thickness of $\lambda/4/n_{Av1}$, where $\lambda$ is an emission wavelength of said VCSEL device and $n_{Av1}$ is an average refractive index of said first layer calculated by an equation of, $$n_{Av1}=(d_1 \times n_1 + d_2 \times n_2)/(d_1+d_2),$$

where $d_1$ and $d_2$ are thicknesses of said first and second films, respectively, and $n_1$ and $n_2$ are refractive indices of said first and second films, respectively.

2. The VCSEL device according to claim 1,
wherein said junction region forms a mesa shape including said pn junction, and
wherein said semiconductor layer forms a step on a top surface thereof covered with said dielectric Bragg reflector.

3. The VCSEL device according to claim 2,
wherein said semiconductor Bragg reflector and said dielectric Bragg reflector form an optical resonator to define a standing wave of an electric field of light resonated with said optical resonator, and
wherein said standing wave sets a node in an interface between said semiconductor layer and said dielectric Bragg reflector.

4. The VCSEL device according to claim 3,
wherein said semiconductor layer includes a spacer and a contact layer, said spacer buries said mesa shape of said junction region, and said contact layer forms said interface with said dielectric Bragg reflector.

5. The VCSEL device according to claim 1,
wherein said semiconductor layer includes a spacer to bury said junction region and another semiconductor Bragg reflector provided on said spacer,
wherein said other semiconductor Bragg reflector includes a plurality of third semiconductor layers and a plurality of fourth semiconductor layers alternately stacked to said third semiconductor layers, and
wherein said other semiconductor Bragg reflector constitutes, cooperated with said dielectric Bragg reflector, a hybrid Bragg reflector to form an optical resonator of said VCSEL device.

* * * * *